(12) United States Patent
Sweatt

(10) Patent No.: US 6,700,644 B2
(45) Date of Patent: Mar. 2, 2004

(54) CONDENSER FOR PHOTOLITHOGRAPHY SYSTEM

(75) Inventor: William C. Sweatt, Albuquerque, NM (US)

(73) Assignee: EUV LLC, Santa Clara, CA (US)

( * ) Notice: Subject to any disclaimer, the term of this patent is extended or adjusted under 35 U.S.C. 154(b) by 23 days.

(21) Appl. No.: 10/163,791

(22) Filed: Jun. 5, 2002

(65) Prior Publication Data

US 2003/0227606 A1 Dec. 11, 2003

(51) Int. Cl.[7] .................. G03B 27/42; G03B 27/52; G03B 5/08; G21K 5/00
(52) U.S. Cl. .................. 355/53; 355/67; 359/857; 359/858; 378/34; 378/85
(58) Field of Search .................. 355/53, 67; 359/224, 359/239, 364, 365, 366, 730, 731, 857, 858, 859; 378/34, 85

(56) References Cited

U.S. PATENT DOCUMENTS

| | | | | |
|---|---|---|---|---|
| 5,315,629 A | * | 5/1994 | Jewell et al. | 378/34 |
| 5,870,176 A | | 2/1999 | Sweatt et al. | |
| 6,072,852 A | * | 6/2000 | Hudyma | 378/34 |
| 6,183,095 B1 | * | 2/2001 | Hudyma | 359/857 |
| 6,262,836 B1 | * | 7/2001 | Hudyma et al. | 359/366 |
| 6,318,869 B1 | * | 11/2001 | Hudyma | 359/857 |
| 6,522,716 B1 | * | 2/2003 | Murakami et al. | 378/34 |
| 6,556,648 B1 | * | 4/2003 | Bal et al. | 378/34 |

OTHER PUBLICATIONS

Smith, "Proceedings of the Society of Photo-optical Instrumentation Meeting, Seminar-in-Depth, Applications of Geometrical Optics", Aug. 27-29, 1973, Optical Society of America, vol. 39, p. 127-140.*

* cited by examiner

Primary Examiner—Alan Mathews
(74) Attorney, Agent, or Firm—Fliesler Dubb Meyer & Lovejoy LLP

(57) ABSTRACT

A condenser for a photolithography system, in which a mask image from a mask is projected onto a wafer through a camera having an entrance pupil, includes a source of propagating radiation, a first mirror illuminated by the radiation, a mirror array illuminated by the radiation reflected from said first mirror, and a second mirror illuminated by the radiation reflected from the array. The mirror array includes a plurality of micromirrors. Each of the micromirrors is selectively actuatable independently of each other. The first mirror and the second mirror are disposed such that the source is imaged onto a plane of the mask and the mirror array is imaged into the entrance pupil of the camera.

50 Claims, 9 Drawing Sheets

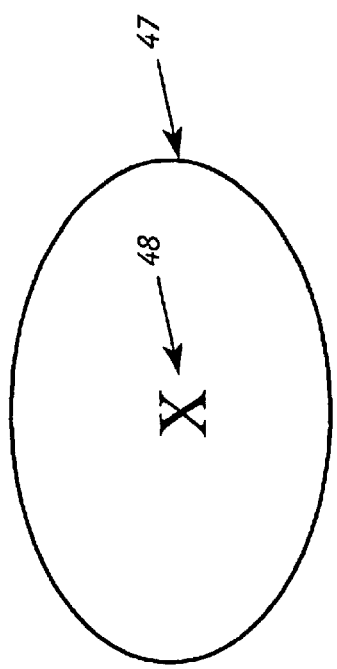
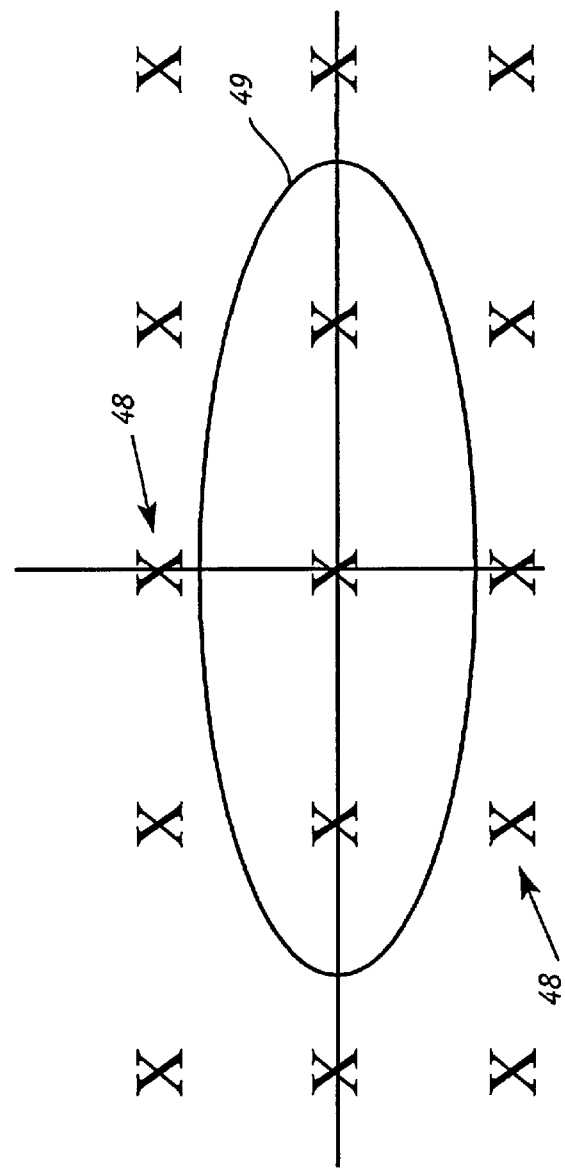
FIG. 7A
FIG. 7B

CONDENSER FOR PHOTOLITHOGRAPHY SYSTEM

This invention was made with Government support under Contract No. DE-AC04-94AL85000 awarded by the U.S. Department of Energy to Sandia Corporation. The Government has certain rights to the invention.

FIELD OF THE INVENTION

This invention relates to condensers that collect radiation and deliver it to a ringfield. More particularly, this condenser collects radiation, here soft x-rays, from either a small, incoherent source or a synchrotron source and couples it to the ringfield of a camera designed for projection lithography.

BACKGROUND OF THE INVENTION

In general, lithography refers to processes for pattern transfer between various media. A lithographic coating is generally a radiation-sensitized coating suitable for receiving a projected image of the subject pattern. Once the image is projected, it is indelibly formed in the coating. The projected image may be either a negative or a positive of the subject pattern. Typically, a "transparency" of the subject pattern is made having areas which are selectively transparent, opaque, reflective, or non-reflective to the "projecting" radiation. Exposure of the coating through the transparency causes the image area to become selectively crosslinked and consequently either more or less soluble (depending on the coating) in a particular solvent developer. The more soluble (i.e., uncrosslinked) areas are removed in the developing process to leave the pattern image in the coating as less soluble crosslinked polymer.

Projection lithography is a powerful and essential tool for microelectronics processing. As feature sizes are driven smaller and smaller, optical systems are approaching their limits caused by the wavelengths of the optical radiation. "Long" or "soft" x-rays (a.k.a. Extreme UV) (wavelength range of $\lambda$=100 to 200 Å ("Angstrom") are now at the forefront of research in efforts to achieve the smaller desired feature sizes. Soft x-ray radiation, however, has its own problems. The complicated and precise optical lens systems used in conventional projection lithography do not work well for a variety of reasons. Chief among them is the fact that there are no transparent, non-absorbing lens materials for soft x-rays and most x-ray reflectors have efficiencies of only about 70%, which in itself dictates very simple beam guiding optics with very few surfaces.

One approach has been to develop cameras that use only a few surfaces and can image with acuity (i.e., sharpness of sense perception) only along a narrow arc or ringfield. Such cameras then scan a reflective mask across the ringfield and translate the image onto a scanned wafer for processing. Although cameras have been designed for ringfield scanning (e.g., Jewell et al., U.S. Pat. No. 5,315,629, Offner, U.S. Pat. No. 3,748,015, and Hudyma et al, U.S. Pat. Nos. 6,262,836 and 6,318,869), available condensers that can efficiently couple the light from a synchrotron source to the ringfield required by this type of camera have not been fully explored. Furthermore, full field imaging, as opposed to ringfield imaging, requires severely aspheric mirrors in the camera. Such mirrors cannot be manufactured to the necessary tolerances with present technology for use at the required wavelengths.

The present state-of-the-art for Very Large Scale Integration ("VLSI") involves chips with circuitry built to design rules of 0.13 $\mu$m. Effort directed to further miniaturization takes the initial form of more fully utilizing the resolution capability of presently-used ultraviolet ("UV") delineating radiation. "Deep UV" (wavelength range of $\lambda$=0.3 $\mu$m to 0.1 $\mu$m), with techniques such as phase masking, off-axis illumination, and step-and-repeat may permit design rules (minimum feature or space dimension) of 0.10 $\mu$m or slightly smaller.

To achieve still smaller design rules, a different form of delineating radiation is required to avoid wavelength-related resolution limits. One research path is to utilize electron or other charged-particle radiation. Use of electromagnetic radiation for this purpose will require x-ray wavelengths. Various x-ray radiation sources are under consideration. One source, the electron storage ring synchrotron, has been used for many years and is at an advanced stage of development. Synchrotrons are particularly promising sources of x-rays for lithography because they provide very stable and defined sources of x-rays, however, synchrotrons are massive and expensive to construct. They are cost effective only when serving several steppers.

Another source is the laser plasma source (LPS), which depends upon a high power, pulsed laser (e.g., a yttrium aluminum garnet ("YAG") laser), or an excimer laser, delivering 500 to 1,000 watts of power to a 50 $\mu$m to 250 $\mu$m spot, thereby heating a source material to, for example, 250,000° C., to emit x-ray radiation from the resulting plasma. LPS is compact, and may be dedicated to a single production line (so that malfunction does not close down the entire plant). The plasma is produced by a high-power, pulsed laser that is focused on a metal surface or in a gas jet.

Discharge plasma sources have been proposed for photolithography. Capillary discharge sources have the potential advantages that they can be simpler in design than both synchrotrons and LPS's, and that they are far more cost effective. This source is capable of generating narrow-band EUV emission at 13.5 nm from the 2–1 transition in the hydrogen-like lithium ions. Another source is the pulsed capillary discharge source which is expected to be significantly less expensive and more efficient than the laser plasma source.

Projection lithography has natural advantages over proximity printing. One advantage is that the likelihood of mask damage is reduced, which reduces the cost of the now larger-feature mask. Imaging or camera optics in-between the mask and the wafer compensate for edge scattering and, so, permit use of longer wavelength radiation. Use of extreme ultra-violet radiation (a.k.a., soft x-rays) increases the permitted angle of incidence for glancing-angle optics. The resulting system is known as extreme UV ("EUVL") lithography (a.k.a., soft x-ray projection lithography ("SXPL")).

A favored form of EUVL is ringfield scanning. All ringfield optical forms are based on radial dependence of aberration and use the technique of balancing low order aberrations, i.e., third order aberrations, with higher order aberrations to create long, narrow illumination fields or annular regions of correction away from the optical axis of the system (regions of constant radius, rotationally symmetric with respect to the axis). Consequently, the shape of the corrected region is an arcuate or curved strip rather than a straight strip. The arcuate strip is a segment of the circular ring with its center of revolution at the optic axis of the camera. See FIG. 4 of U.S. Pat. No. 5,315,629 for an exemplary schematic representation of an arcuate slit defined by width, W, and length, L, and depicted as a portion of a ringfield defined by radial dimension, R, spanning the distance from an optic axis and the center of the arcuate slit. The strip width is a function of the smallest feature to be printed with increasing residual astigmatism, distortion, and Petzval curvature at distances greater or smaller than the design radius being of greater consequence for greater resolution. Use of such an arcuate field allows minimization of radially-dependent image aberrations in the image. Use of object:image size reduction of, for example, 5:1 reduction, results in significant cost reduction of the, now, enlarged-feature mask.

It is expected that effort toward adaptation of electron storage ring synchrotron sources for EUVL will continue. Economical high-throughput fabrication of 0.13 µm or smaller design-rule devices is made possible by use of synchrotron-derived x-ray delineating radiation. Large angle collection over at least 100 mrad will be important for device fabrication. Design of collection and processing optics for the condenser is complicated by the severe mismatch between the synchrotron light emission pattern and that of the ringfield scan line.

Sweatt, U.S. Pat. No. 5,512,759, discloses a condenser for collecting and processing illumination from a synchrotron source and directing the illumination into a ringfield camera designed for photolithography. The condenser employs a relatively simple and inexpensive design, which utilizes spherical and flat mirrors that are easily manufactured. The condenser employs a plurality of optical mirrors and lenses, which form collecting, processing, and imaging optics to accomplish this objective.

Sweatt, U.S. Pat. No. 5,361,292, discloses a condenser that includes a series of aspheric mirrors on one side of a small, incoherent source of radiation. If the mirrors were continuously joined into a parent mirror, they would image the quasi point source into a ring image with a diameter of a few tens of centimeters at some distance, here some number of meters. Since only a relatively small arc (about 60 degrees) of the ring image is needed by the camera, the most efficient solution is to have about five 60° beams, all of which are manipulated such that they all fall onto the same arc needed by the camera. Also, all of the beams must be aimed through the camera's virtual entrance pupil. These requirements are met in two steps.

First, the beams are individually rotated and translated, as necessary, using mirrors so that they overlap at the ringfield and pass through the real entrance pupil without interfering with each other. The second step is to image this real entrance pupil into the camera's virtual entrance pupil using a powered imaging mirror. This places the corrected, combined images of the mirrors into the proper position for use by the camera. This system may be configured in a variety of ways.

Despite the advantages in condenser designs for projection lithography, the art is in search of techniques that enhance critical dimension (CD) control.

Condenser designs such as those disclosed by Sweatt are quite efficient in that they collect about 1 steradian of light from a small point incoherent source or 20° or 30° from a synchrotron and pass it through the ringfield and into the entrance pupil. However, the illumination pattern in the entrance pupil is far from uniform causing a large CD error.

The 3-nm CD error typically obtained with 100-nm features using current techniques is quite large and requires that the masks be designed and then modified to remove these predictable errors. This mask modification step is an iterative procedure where the mask geometry corrections are estimated and then the corrected mask must be modeled. This step adds expense and uncertainty to the function of the completed chips, even possibly requiring a redesign and the fabrication of a new set of masks.

Although the above described condensers are commercially viable, each of the aforementioned condensers is limited in its ability to change coherence of the radiation at the entrance pupil of the camera without changing the configuration of the mirrors within the condenser. Furthermore, each of the aforementioned condensers is limited in its ability to engineer the illumination of the source image.

SUMMARY OF THE INVENTION

It is an object of the present invention to overcome one or more limitations of the prior art hereinabove enumerated. It is another object of the present invention to provide a condenser that can change coherence of radiation at the entrance pupil of the condenser. It is a further object of the present invention to provide a condenser in which the source image may be engineered.

Furthermore, another object of the present invention is to allow the intensity at the mask to be varied, for example, to make it uniform to the limits of measurement.

In one embodiment, the invention is directed to a condenser for a photolithography system wherein a mask image from a mask is projected onto a wafer through a camera having an entrance pupil, said condenser including:

a source of propagating radiation;

a first mirror illuminated by said radiation;

a mirror array illuminated by said radiation reflected from said first mirror, said mirror array including a plurality of micromirrors, each of said mirrors being selectively actuatable independently of each other; and a second mirror illuminated by said radiation reflected from said array, said first mirror and said second mirror being disposed such that said source is imaged onto a plane of said mask and said mirror array is imaged into said pupil.

In another embodiment, the invention is directed to a photolithography system wherein an image of a mask is projected onto a wafer that includes:

a source of propagating EUV radiation;

a first mirror illuminated by said radiation;

a mirror array illuminated by said radiation reflected from said first mirror, said mirror array including a plurality of micromirrors, each of said mirrors being selectively actuatable independently of each other;

a second mirror illuminated by said radiation reflected from said array; and a camera operable in a wavelength of said radiation and having an entrance pupil, said first mirror and said second mirror being disposed such that said source is imaged onto a plane of said mask and said mirror array is imaged into said pupil.

A feature of the present invention is that the partial coherence or the illumination in the entrance pupil can be changed on the fly. Another feature of the present invention is that the illumination at a slit in the mask plane may be engineered, for example, made uniform across the mask.

The present invention is advantageous over the prior art in that the number of mirrors (counting the array as a single mirror) used within the condenser is reduced. This increases the condenser's transmission so less source power is needed.

These and other advantages, objects and features of the present invention will become readily apparent to those skilled in the art from a study of the following Description of the Exemplary Preferred Embodiments when read in conjunction with the attached Drawing and the appended Claims.

BRIEF DESCRIPTION OF THE DRAWINGS

FIGS. 7A and 7B respectively illustrate one possible source image and a print of overlapping source images in the photolithography system of FIG. 6;

DESCRIPTION OF THE EXEMPLARY PREFERRED EMBODIMENT

Figure 1:
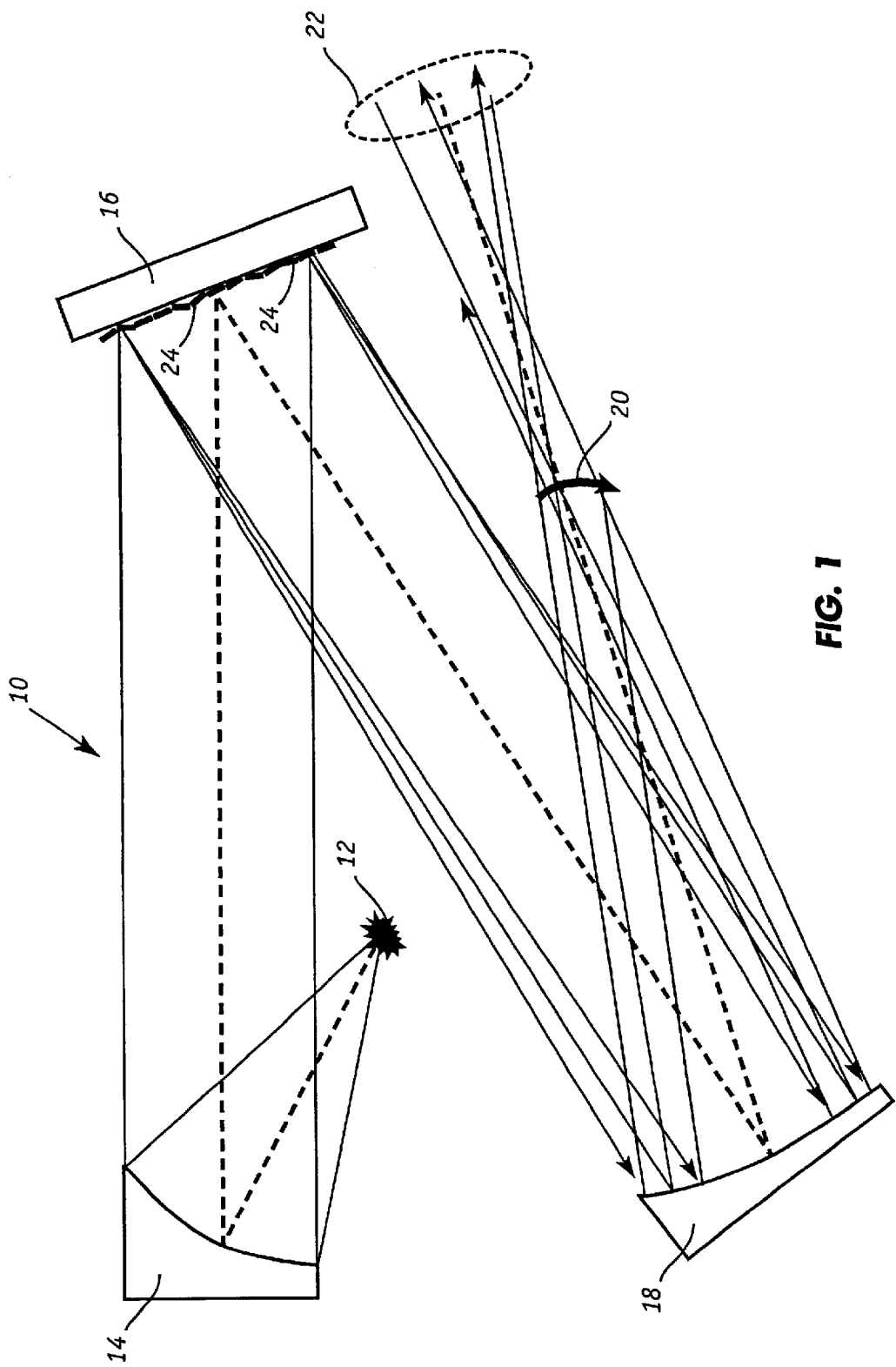
FIG. 1 is a schematic diagram of one embodiment of a condenser constructed according to the principles of the present invention.

Referring now to FIG. 1, there is shown a first embodiment of a condenser 10 constructed according to the principles of the present invention. The condenser 10 includes a source 12 of propagating radiation, a first mirror 14, a mirror array 16 and a second mirror 18. The first mirror 14 and the second mirror 18 image the source 12 into a mask plane, generally shown at 20, and the mirror 18 images the mirror array 16 into an entrance pupil, generally shown at 22, of a photolithography camera. Conventional sources of propagation radiation can be employed. Preferred sources include, for example, (i) laser plasma source which is described in Kubiak et al., U.S. Pat. No. 5,577,092 which is incorporated herein, (ii) capillary discharge sources as described in Klosner et al., "Intense Plasma Discharge Source at 13.5 nm for Extreme-Ultraviolet Lithography," Opt. Lett. 22, 34 (1997) which is incorporated herein, and (iii) pulsed capillary discharge sources which are described in Silfvast U.S. Pat Nos. 5,499,283 and 6,031,241, which are incorporated herein. Suitable conventional cameras can be employed and theses include, for example, (i) ringfield cameras as described in Jewell U.S. Pat. No. 5,315,629, Offner U.S. Pat. No. 3,748,015, and Hudyma et al U.S. Pat. Nos. 6,262,836 and 6,318,869, which are incorporated herein and (ii) the Schwartzchild camera which is typified by the MET camera, which is described further herein.

In accordance with the present invention, the mirror array 16 includes a plurality of micromirrors 24. Each of the micromirrors 24 may be selectively actuated or tilted in 2 dimensions independently of each other one of the micromirrors 24. The selective actuation of each of the micromirrors 24 in the mirror array 16 provides for all of the micromirrors 24 to be independendly oriented. The independent orientation in turn allows the partial coherence of the illumination in the entrance pupil 22 to be controlled and for the intensity of the radiation from the source 12 at the mask plane 20 to be uniformly distributed. As used hereinafter, the term micromirror refers to a reflecting surface, that is disposed on a substrate, whose principal dimension is about 1 to 4 mm and typically about 2 mm. The micromirrors are preferably substantially rectangular with each micromirror being separated by no more than substantially 15 µm. The micromirrors preferably have a tilt range between substantially ±2 mr and ±40 mr and preferably each of the micromirrors deviates from a flatness by less than substantially 200 nm. The total number of micromirrors typically range from 200 to 1000.

Figure 2A:
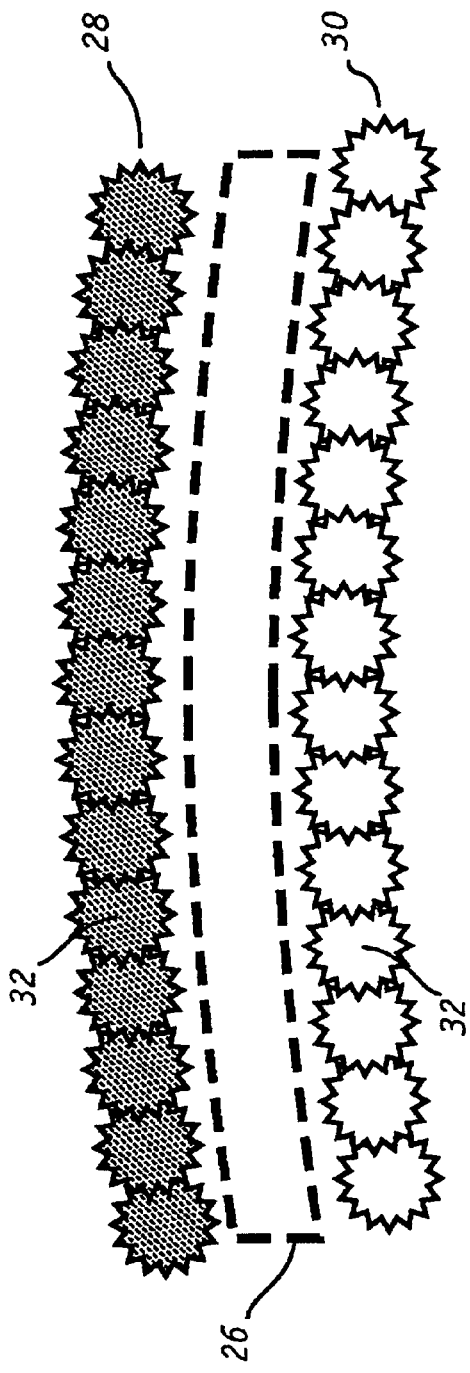
FIGS. 2A and 2B illustrate overlapping source images and overlapping lines of images as filling an aperture.
Figure 2B:
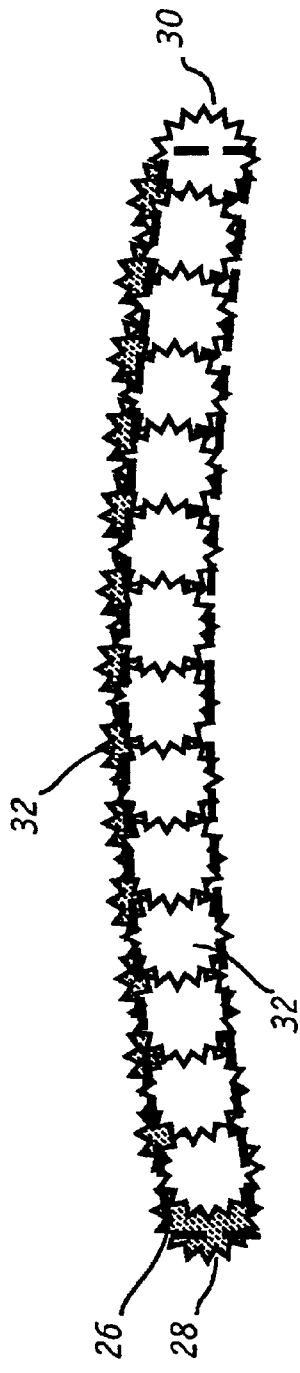

With reference to FIGS. 2A and 2B, there is illustratively shown the fill of an aperture, such as exemplary arcuate slit 26 typically associated with large print area EUVL cameras, at the mask plane 20. In FIG. 2A, in an exploded view, there is shown a first line 28 and a second line 30 of a plurality of spots 32. Each of the spots 32 is an image of the source 12 reflected from a respective group of the micromirrors 24. In each of the first line 28 and the second line 30, the spots 32 may slightly overlap each other as best seen in FIG. 2A. Each of the first line 28 and the second line 30 of spots 32 may further be offset from each other to fill the slit 26, as best seen in FIG. 2B.

Each of the micromirrors 24 is individually tilted such that each of the spots 32 is illuminated by a selected number of the micromirrors 24 in each respective one of the groups. For example, each of the groups of the micromirrors 24 may preferably include at least thirty-five (35) of the micromirrors 24, although of course a lesser or substantially greater number may be used depending upon the specific application or design of the condenser 10.

In a ring-field lithography system the arcuate slit is scanned across the mask. Therefore it integrates the exposure along that direction. Consequently the uniformity of the field across the width of the slit (scan direction) is unimportant. Only the integral of the intensity across the width of the slit is important. The variation of this integral along the length of the slit is crucial. It must be uniform, preferably varying by less than 0.1%. This uniformity can be achieved with only about 30 spots when they are Gaussian in profile.

Figure 3:
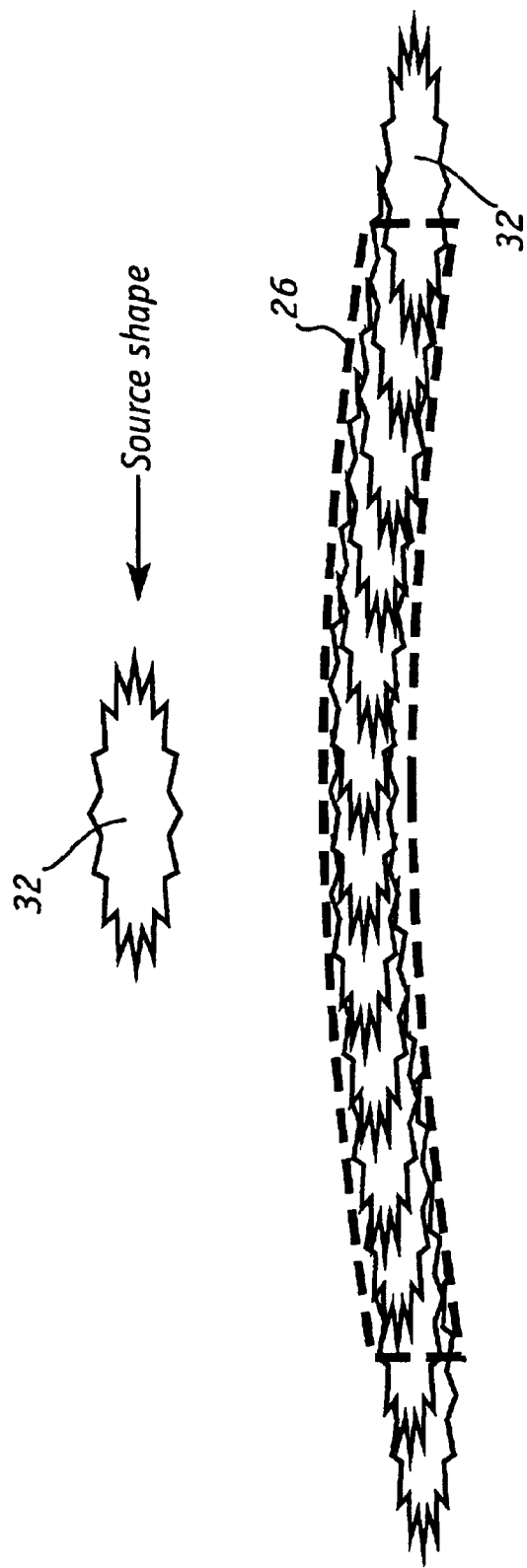
FIG. 3 illustrates the feature of the present invention to alter the source image in the slit.

Another consideration for the number of micromirrors 24 chosen for each spot 32 is that depending on the shape of the source, each spot 32 can be elongated, as best seen in FIG. 3, by using more micromirrors 24 per spot. If the source is spherical, then the images will be round. If the source appears elliptical, the images will all appear elliptical. Accordingly, a smaller number of spots 32 are needed to obtain uniform fill of the slit 26. Therefore, the fill of the entrance pupil 22 for any point along the slit 26 is more uniform allowing the partial coherence of the radiation to be varied more smoothly.

From the mask plane 20 looking toward the entrance pupil 22, the point sources from each of the micromirrors 24 in any one of the groups seen at the entrance pupil 22 would thus be randomly arranged but fairly uniformly scattered about in the entrance pupil 22. Thus, at the entrance pupil 22, the point sources observed from all of the micromirrors 24 from all of the groups will result in a changing pattern of point sources with the illumination and intensity remaining substantially uniform.

Each spot 32 is created by a group of "N" micromirrors, all tilted to direct the images of the source to the individual spot 32. The number "N" is selected as follows:

First the desired illumination pattern constructed in the entrance pupil is selected based on the partial coherence properties desired by the chip maker. This pattern can be (1) a disk shape with a radius "sigma" normalized to that of the entrance pupil, (2) an annular shape with normalized outer and inner radii "sigma" and "tau", (3) a quadrapole shape, or (4) any other desired shape.

Next, the desired illumination pattern and the image of the micromirror array in the camera entrance pupil are compared. Any micromirror outside the pattern will not be used and is tilted so that the light misses the slit at the mask. The number of micromirrors "M" remaining in the desired illumination pattern is counted.

The number of micromirrors "N" that will be used to create each individual spot 32 is therefore approximately "M" divided by the number of spots in spot array 33.

Note that "N" should be greater than approximately 10 and preferably greater than 20.

The number of micromirrors required to create each spot at the mask plane depends on the pattern in the camera pupil that defines the partial coherence. From rough calculations, a minimum of about 20 micromirrors in the illuminated part of the entrance pupil gave acceptable uniformity of critical dimension control. So if the lithography requires a partial coherence that illuminates as little as 40% of the aperture, the design rule would specify a condenser with 20/0.40=50 micromirrors per spot at the mask. Thus if the camera is the above-referenced Hudyma type high numerical aperture ring-field camera, one would want to have at least (50 micromirrors/spot×30 spots) 1500 micromirrors imaged into the pupil of the camera. This would be a round 2-D array where a diameter of the array cuts across about 40 to 50 micromirrors.

Most preferably, all of the mask area would be illuminated by all of the micromirrors to be sure that all of it is illuminated with exactly the same partial coherence. Typically this will not be possible due to intensity variations at the mask. Therefore each point on the mask will be illuminated by one or preferably a few spots 32. In order to approximate the desired partial coherence in the area illuminated by an individual spot 32, the group of "N" micromirrors that illuminate spot 32 must be fairly uniformly distributed throughout the area of the desired illumination pattern. If the number of micromirrors "N" is approximately 20 or greater and the micromirrors are well spread out, then the resulting print quality will be indistinguishable from that achievable by the whole of the desired illumination pattern. FIG. 2b shows an arcuate mask area that is illuminated by two overlapping arrays of spots 32. Note that the spots in each array also overlap one-another somewhat. The result is that any point on the mask is illuminated by 3 or 4 spots, each created by perhaps 20 micromirrors. Therefore, the "fill" of the desired illumination pattern will be quite smooth and uniform.

Figure 4:
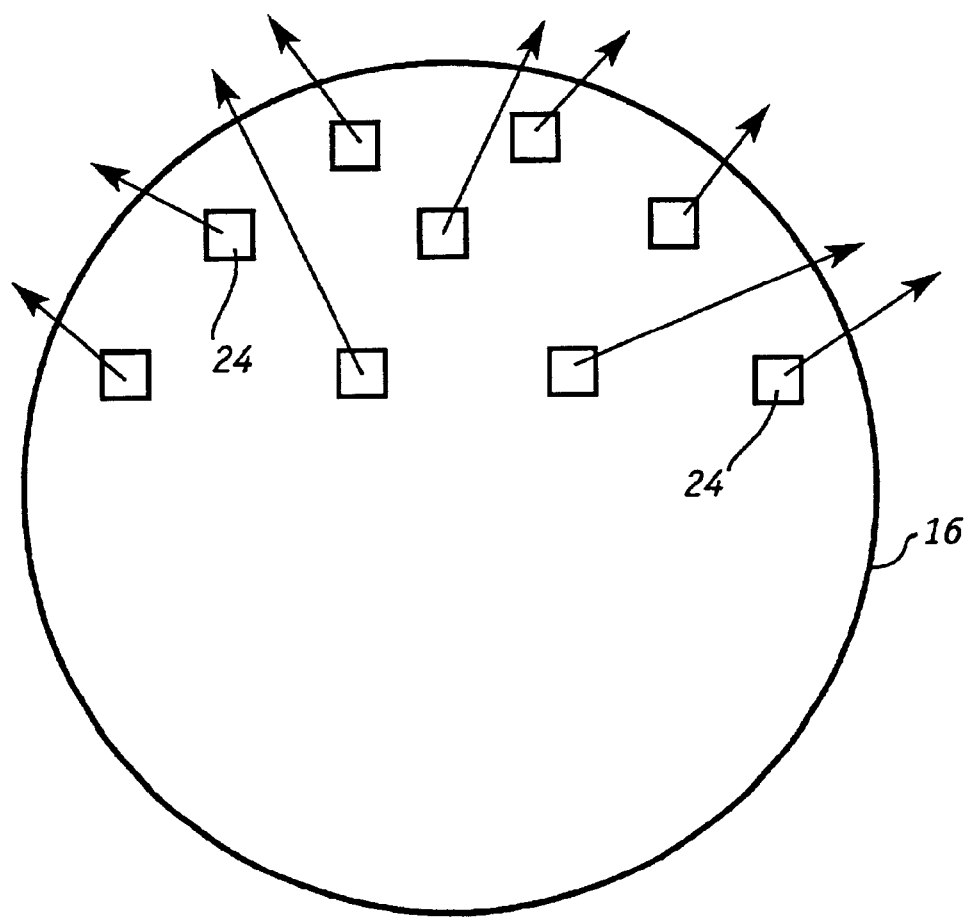
FIG. 4 is a top view of the mirror array showing the orientation of several mirrors to illustrate another feature of the present invention.

In the event the radiation arriving at the micromirror array contains "hot spots", selected micromirrors 24 could be oriented to direct radiation away from the slit 26 leaving a "smoothed pupil intensity profile," as best seen in FIG. 4. The remaining group of micromirrors would then be used to illuminate the slit as depicted in FIG. 2b.

Figure 5:
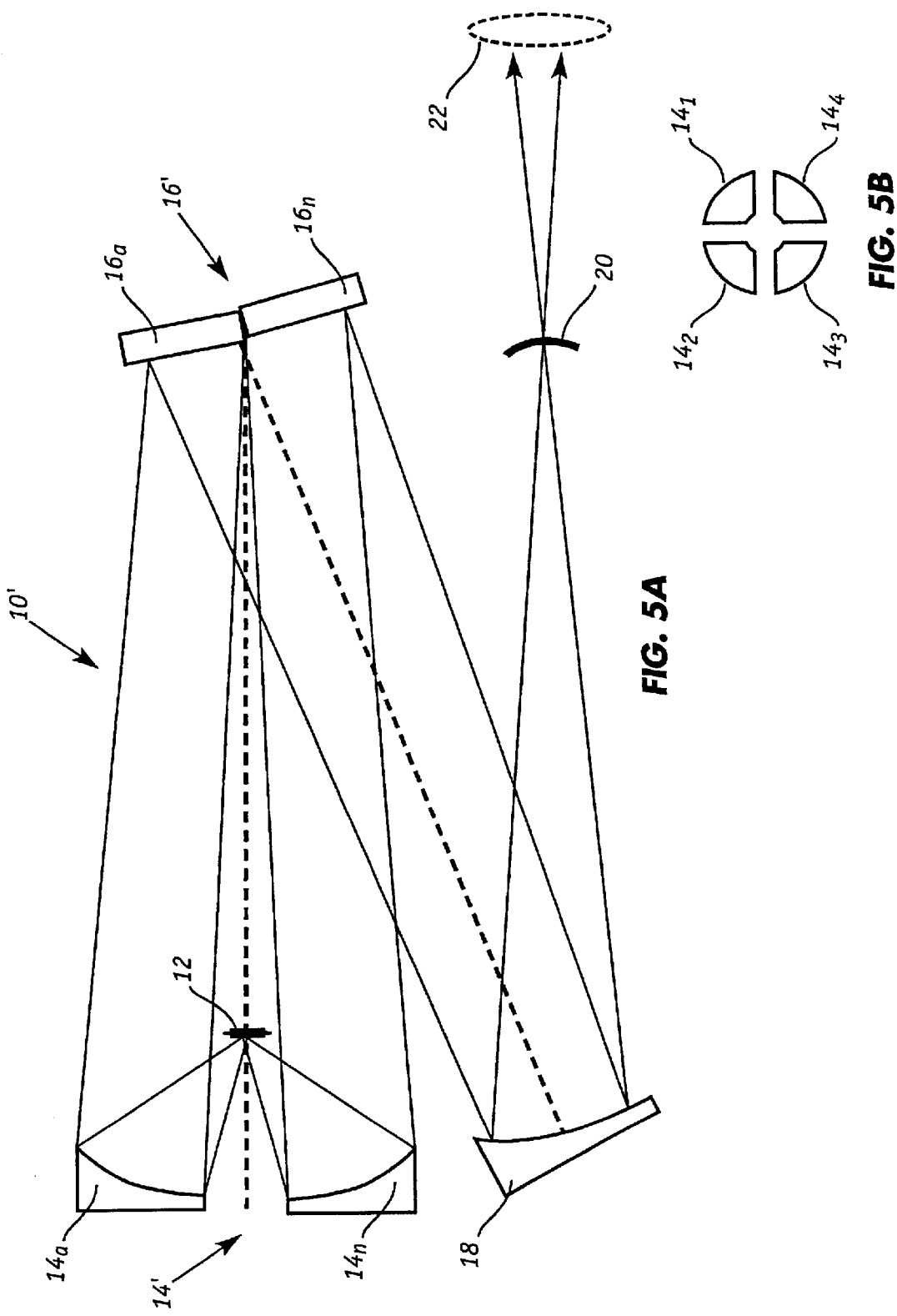
FIG. 5A is a schematic diagram of another embodiment of a condenser constructed according to the principles of the present invention.
FIG. 5B is a cross section of reflected radiation from a four segment first mirror according to one aspect of the present invention.

Another embodiment of the present invention is useful for a high numerical aperture photolithography camera with a large print area. A condenser 10' may include a first mirror 14' having a plurality of mirror segments $14_{a-n}$, and a mirror array 16' having a plurality of mirror arrays $16_{a-n}$, as best seen in FIG. 5A. Each of the mirror arrays $16_{a-n}$ is illuminated by a reflected beam from a respective one of the mirror segments $14_{a-n}$. All other elements of the condenser 10', identified by like reference numerals of the condenser 10 of FIG. 1, are as herein above described.

Each of the mirror arrays $16_{a-n}$ may be, in one embodiment of the present invention, one quadrant of the mirror array 16' having preferably a one hundred millimeter (100 mm) diameter. Each of the micromirrors 24 in of the mirror arrays $16_{a-n}$ may then preferably have a major dimension of substantially three millimeter (3 mm). The flatness and the roughness of the surface of each of the micromirrors 24 is as herein above described. The tilt angle of each of the may preferably be five hundredths radian to either side of a normally flat position (±0.050 rad) which may provide a six bit resolution. In a preferred embodiment, each of the micromirrors is selectively actuated within a tilt angle range in 2 dimensions.

The condenser 10' of FIG. 5A is particularly useful with an advanced camera having a numerical aperture (na), for example, na=0.25, and wherein of the slit 26 has a width of substantially two millimeter (2 mm) for a source diameter less than 0.5 mm. Each of the mirror segments $14_{a-n}$ may preferably be one hundred fifty millimeter (150 mm) F/0.9 mirrors. The second mirror 18 may then preferably be a forty millimeter (40 mm) F/6 mirror. The distance from the mirror array 16' to the first mirror 14' may preferably be one and seven-tenths meter (1.7 m) and to the second mirror 18 may preferably be 2 meter (2 m).

As is known, the segmentation of the first mirror 14' allows for physical, electrical and coolant connections to be made to the source 12 in the center of the radiation beam reflected from the mirror segments $14_{a-n}$. In an embodiment of the present invention, wherein there are four mirror segments $14_{a-n}$ and four mirror arrays $16_{a-n}$, the resultant beam cross section may best be seen in FIG. 5B. Variations of the above configuration are possible. In the basic architecture, illumination from the source is collected by a focusing "collecting mirror" and is relayed to the nominally round array of micromirrors.

The basic optical architecture is as follows: the illumination from the source is collected by a focusing "collecting mirror" and is relayed to the nominally round array of micromirrors. The light reflects off the micromirrors. The desired fraction of the light in the engineered illumination pattern is directed to a focusing "relay mirror" that images the source into the mask plane and images the array of micromirrors into the camera pupil. The collecting mirror can be one focusing mirror or it could be two curved mirrors in series if space restrictions and optical requirement were to require it. It could also be 4 essentially identical focusing mirror segments that act essentially as a single mirror. One would choose a more complex design like this only if the etendu of the camera were very large and the source size were very small so a very large collection angle were required to give a large condenser etendu equal to the large camera etendu.

If the collector mirror were segmented, then the micromirror would have to be segmented too, so the four beam segments could all be directed toward the relay mirror. Segmenting the micromirror array also improves the "yield" during fabrication.

The "relay mirror" could be a single focusing mirror or a series of curved mirrors that do the imaging described above. One or more flat mirrors could be inserted anywhere into the optical system to facilitate the connection of the basic parts of the condenser system described above.

Figure 6:
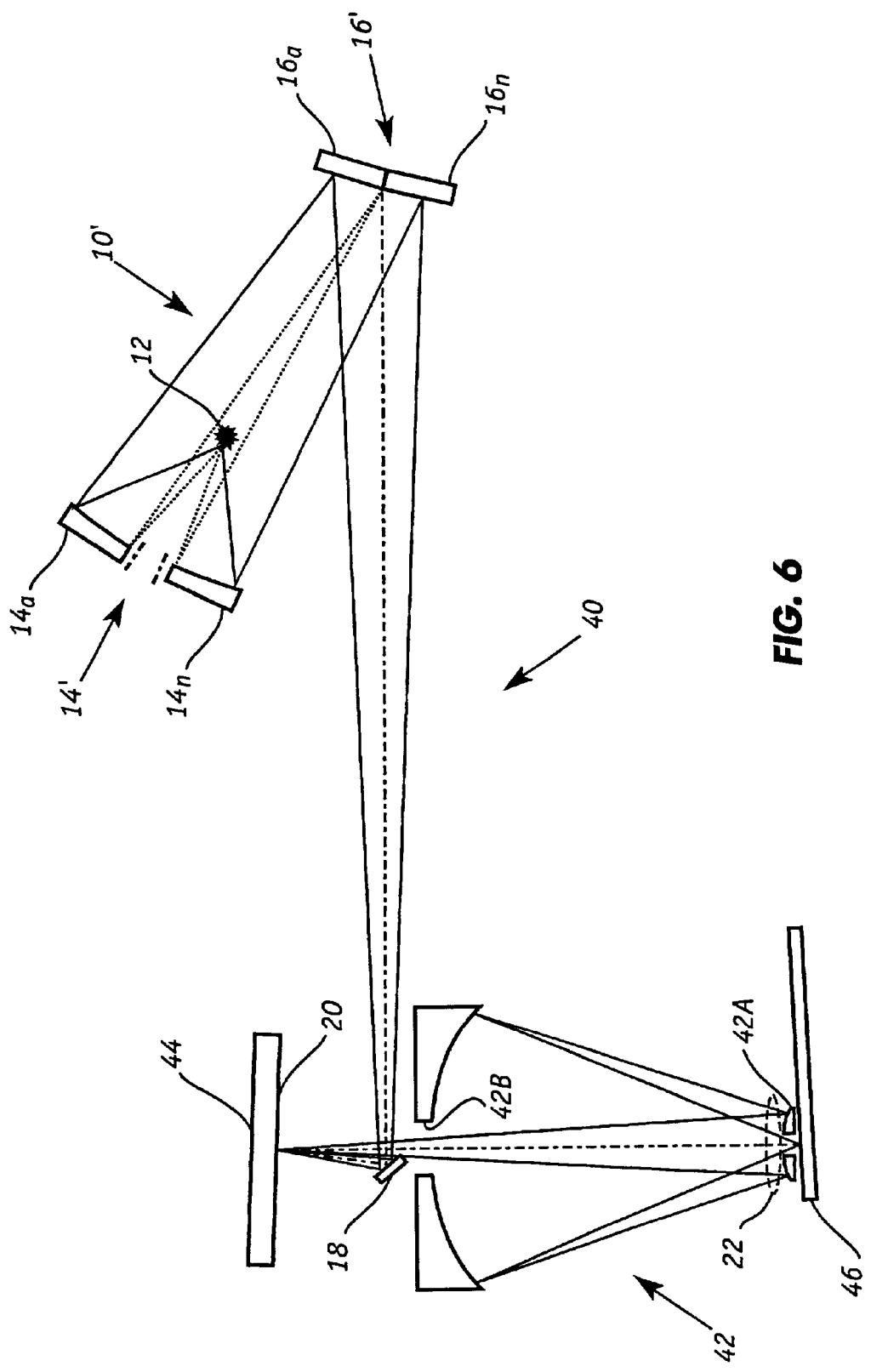
FIG. 6 is one embodiment of a photolithography system illustrating one use of the condenser of FIG. 5A.

Referring now to FIG. 6, there is shown a photolithography system 40 utilizing the herein above described condenser 10' and a Schwartzchild type camera, hereafter referred to as a MET camera 42, described below. In the system 40, the first mirror 14' and the second mirror 18 image the source 12 into the mask plane 20 of a mask 44, and the mirror array 16' images the source 12 into the entrance pupil 22 of the MET camera 42. The image at the mask plane 20 is then projected onto a wafer 46. In the system 40, if all of the micromirrors 24 are in the coplanar position, then all images of the source 12 are developed in the center of the mask 44.

In a preferred embodiment of the present invention, the source 12 may be a laser driven jet source to develop propagating EUVL radiation. In this embodiment of the source 12, a plasma ball is created in a jet of xenon and has an elliptical Gaussian intensity profile. In one embodiment, the intensity profile may have a two hundred fifty micron (250 $\mu$m) diameter and a three hundred seventyfive micron (375 $\mu$m) length, as measured at the 1/e$^2$ points of the ellipse, as best seen in FIG. 7A.

The MET camera with a numerical aperture na=0.3, may have an elliptical print area with a diameter of two hundred micron (200 $\mu$m) and six hundred micron (600 $\mu$m) at the wafer 46, as best seen in FIG. 7B, which corresponds to one millimeter (1 mm) by three millimeter (3 mm) at the mask 12. The MET camera does not scan but rather projects a two dimensional image so it needs uniform intensity and partial coherence over the whole exposure area. Approximately sixty of the micromirrors 24 may be used to produce each spot 47 with center 48 in the print area 49. The numerical aperture, na, at the wafer 46 may be expressed as na=0.3, and at the mask 44 the numerical aperture may be expressed as na=0.06.

In the condenser 10', transmission efficiency of the propagating radiation from the source 12 and its magnification needs to be balanced with uniformity of the radiation incident on the mask 44. For example, if the magnification, A, of the emitted radiation from the source 12 as incident upon the mask 44 may be approximately expressed as A about 6.8, then an elliptical Gaussian image of the source 12 is produced on the mask 44, with an intensity profile of 1.7 mm by two and 2.55 mm.

Each of the micromirrors 24 is preferably square and may have a dimension between two and four millimeters (2–4 mm). A spacing between each of the micromirrors 24 is also preferably no greater than fifteen microns (15 $\mu$m). With this gap width between each of the micromirrors 24, only two percent (2%) of the incident energy upon the mirror array 16' is lost. The overall dimensions of each of the micromirrors 24 is selected to facilitate making the micromirrors 24 flat and also to have the required range and resolution.

For example, surface of each of the individual micromirrors 24 is preferably flat to about 0.7 waves in the visible spectrum so that the source image does not grow by more than five percent. The micro roughness of each of the micromirrors 24 may be preferably less than about one angstrom root mean square so the scattering loss will be less than one percent. For comparison, a 2 $Å_{rms}$ surface may result in a scattering loss of 3.7%. Each of the micromirrors 24 may also have a tilt range of plus or minus two milliradians from the coplanar position.

The mirror array 16' is preferably about 100 mm in diameter. As described above, the mirror array 16' may be broken into segments, preferably four separate quadrants. Each quadrant may preferably be built on a 55–60 mm square substrate.

Figure 8:
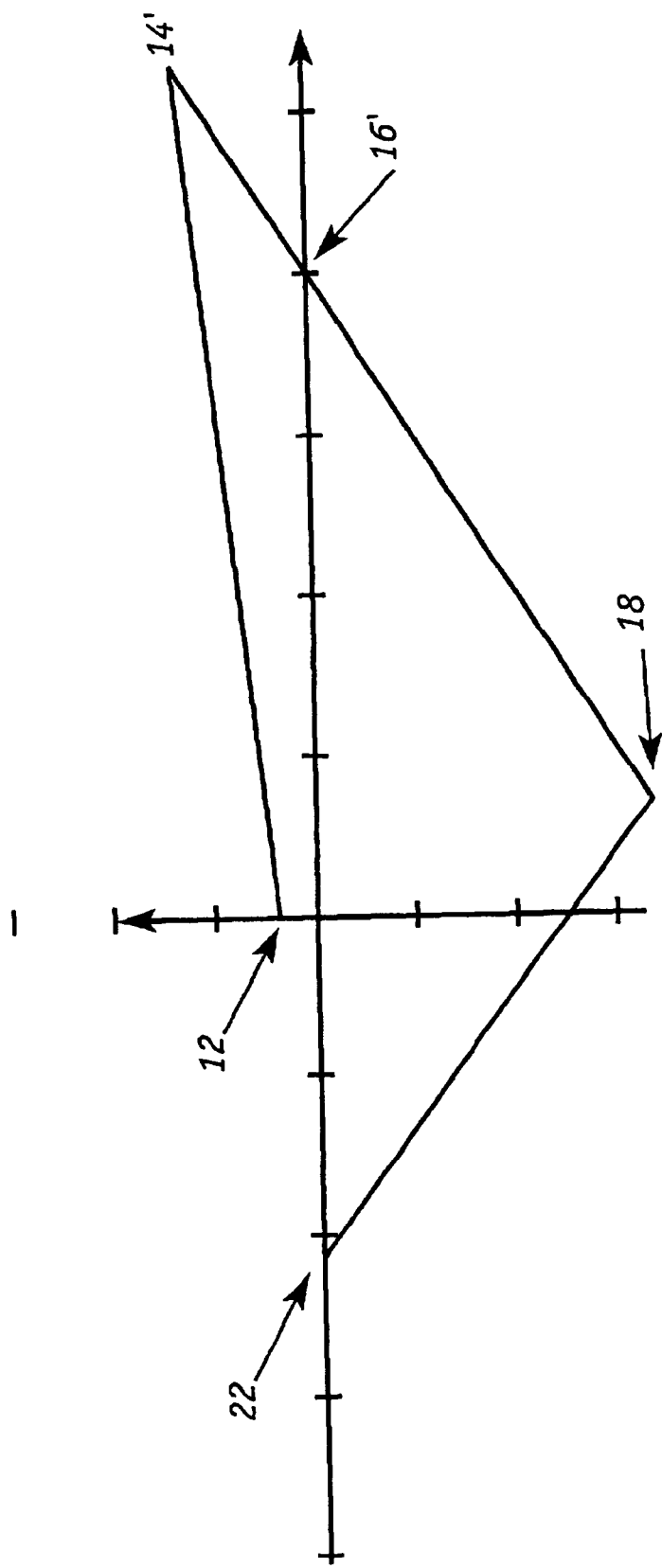
FIG. 8 is a $Y$–$Y_{bar}$ diagram of the photolithography system of FIG. 6.

Referring now to FIG. 8, there is shown a Y–Y$_{bar}$ diagram illustrative of a preferred arrangement of the above identified elements of FIG. 6. Techniques for generating Y–Y$_{bar}$ diagrams are described, for example, in Shack, R. V., *Proceedings Soc. Photo-Opt Instr. Eng.*, vol. 39, 1973, p. 127–140. The first mirror 22 and the source 12 are separated by a distance substantially equal to 150 mm. The first mirror 14' and the mirror array 16' are separated by 440 mm . The mirror array 16' and the second mirror 18 are separated roughly 1150 mm. The second mirror 18 and the mask 44 are separated by about 155 mm. The back focus between the mask 44 and the entrance pupil 22 is about 450 mm.

The source 12 in this example design has a diameter of 0.375 mm. The mirrors 14' and 18 have a focal length of about 144 mm 400 mm, respectively. The source image length at the mask 44 is equal to about 2.55 mm.

Figure 9A:
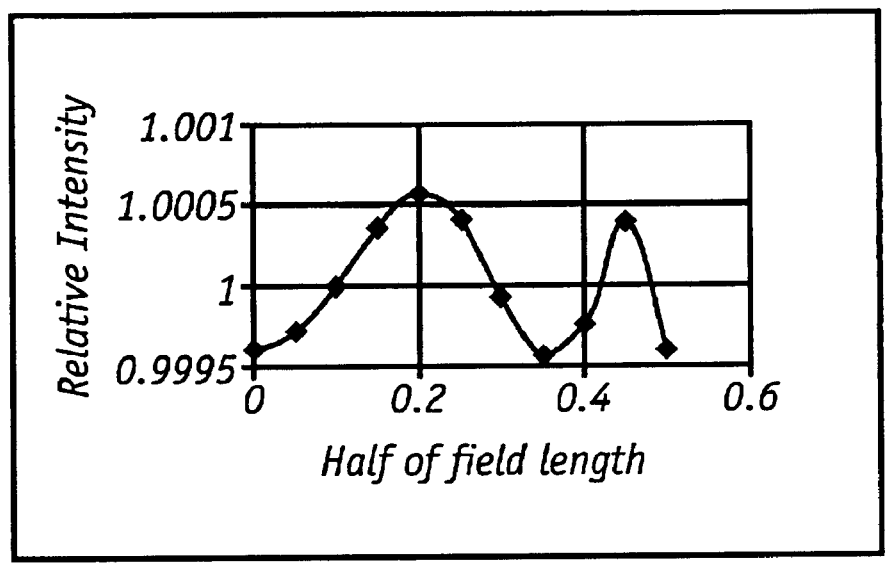
FIGS. 9A and 9B are intensity profiles of a 15-spot array at the mask plane of FIG. 6.
Figure 9B:
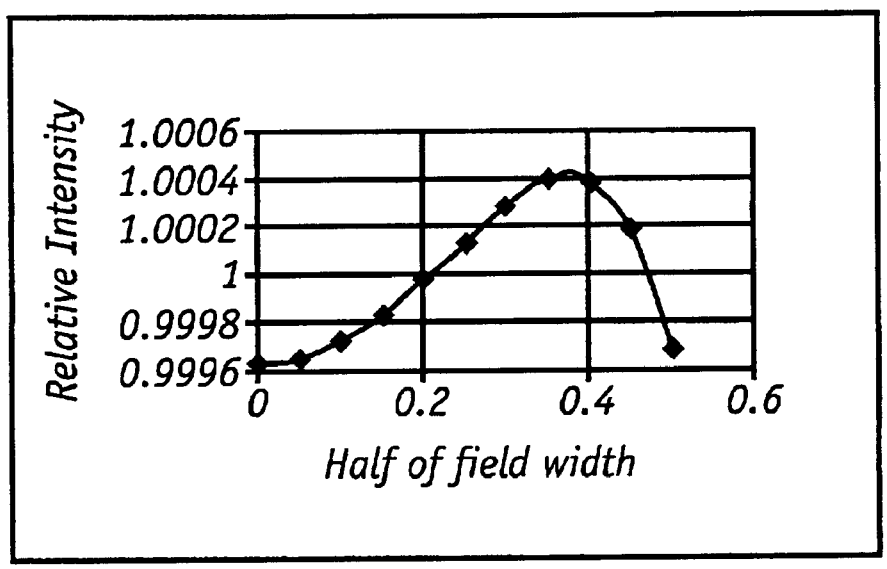

For the example Schwarzchild camera, the mask area 49 to be printed is a 1×3 mm ellipse. The example condenser just described produces an image of the example source that is a 2.5×1.7 mm spot 47 with a Gaussian intensity profile. A 15-spot array as shown in FIG. 7b produces an intensity profile that varies by less than 0.1% within the print area. This is shown in FIGS. 9A and 9B. FIG. 9A is a graph of the intensity along the horizontal axis of the ellipse from the center to one edge. FIG. 9B is a graph of the intensity along the vertical axis of the ellipse from the center to one edge.

The mirror array 16' may include about one thousand micromirrors 24 within an overall one hundred millimeter (100 mm) diameter. Preferably, if all the micromirrors 24 are square, the major dimension of each of the micromirrors 24 will need to be about 2.8 mm. The tip and tilt ranges need to be about ±1 milliradius.

There has been described herein preferred embodiments of a condenser for a photolithography system, and different embodiments of such systems. Those skilled in the art may now make numerous uses of and departres from the herein described embodiments without departing from the inventive concepts disclosed herein.

For example, the micromirror array 16 may be fabricated by any of numerous techniques known in the art, such as surface micromachining in polysilicon. Alternative fabrication techniques may include bulk micromachining, LIGA (an acronym of a German language phrase referring to lithography, electroforming, and injection molding), or the use of additive metal microfabrication based on LIGA, or LIGA-like machining, all as known in the art. Additional fabrication techniques such as chemical-mechanical polishing may be performed to improve the optical quality of the mirrored surface by reducing the surface roughness. Micromirrors are further described in Sweatt et al. U.S. Pat. Nos. 6,060,224 and 5,870,176, which are incorporated herein.

The utility of the condenser 10 has also been described above in conjunction with the filling of the arcuate slit 26 used in an EUVL camera. However, the mirror array 16 enables the condenser 10 of the present invention to fill any mask shape and any aperture shape. The mirror array 16 also allows for changing partial coherence in the aperture at will. The sigma of the fill is futhermore remotely variable, and not unvariable as in fixed mirror condensers. Quadrapole illumination, in which corners of the aperture are more intensely illuminated, is also possible. Other entrance pupil fill geometries, such as annular, disk and grazing incidence illumination, are also possible. The coupling an elliptical source shape into the entrance pupil has been described, however, other source shapes are also possible. Accordingly, the utility of the present invention is not to be limited to the fill of the arcuate slit 26 used in large print area EUVL cameras.

Another application of the current invention is in DUV (deep ultra violet) lithography systems. Such systems are typically refractive systems with many elements and the sources are lasers generating coherent radiation in the 0.3–0.1 micron wavelength range. Thus, they require apparatus and methods for removing or reducing said coherence. The present invention is applicable to DUV and allows engineering of the partial coherence to optimize the printing of small features. Additionally, the intensity of the illumination can be made more uniform across the field or varied to best print specific features in particular sections of the field.

Furthermore, it is to be understood that the specific dimensions of the elements of the present invention described herein, the spatial relationship of such elements to each other, or other measurable parameters or qualities of such elements are not to be construed as limiting upon the present invention or to restrict the present invention to any one exemplary embodiment disclosed herein. Furthermore, all such dimensions, spatial relationships or parameters or qualities in themselves are not to be construed as absolute limitations upon any one element of the present invention. It may be noted that such dimensions, spatial relationships or parameters for qualities of one element may determine an optimal or preferred range of dimensions, a range of spatial relationships or a range of parameters for qualities of another element of the present invention.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed as the invention is:

1. A condenser for a photolithography system wherein a mask image from a mask is projected onto a wafer through a camera having an entrance pupil, said condenser comprising:
   a source of propagating radiation;
   a first mirror illuminated by said radiation;
   a mirror array illuminated by said radiation reflected from said first mirror, said mirror array including a plurality of micromirrors, each of said mirrors being selectively actuatable independently of each other; and
   a second mirror illuminated by said radiation reflected from said array, said first mirror and said second mirror being disposed such that said source is imaged onto a plane of said mask and said mirror array is imaged into said pupil.

2. A condenser as set forth in claim 1 wherein each of said micromirrors is selectively tilted to provide a prescribed spatial coherence in the entrance pupil of the camera for all points in the image field at said entrance pupil.

3. A condenser as set forth in claim 1 wherein each of said micromirrors is selectively tilted such that intensity of said radiation is prescribed within the camera's print area at said mask plane.

4. A condenser as set forth in claim 1 wherein each of said micromirrors is selectively actuatable within a tilt angle range in 2 dimensions.

5. A condenser as set forth in claim 4 wherein said tilt angle is referenced to either side of a normally coplanar position.

6. A condenser as set forth in claim 1 wherein each of said mirrors is selectively actuatable to one of a plurality of discrete positions.

7. A condenser as set forth in claim 1 wherein said first mirror has an elliptical cross-section.

8. A condenser as set forth in claim 7 wherein said elliptical cross-section is substantially a collimating mirror.

9. A condenser as set forth in claim 1 wherein said first mirror includes a plurality of aspherical mirror segments wherein segments are each an off-axis section of an elliptical mirror.

10. A condenser as set forth in claim 1 wherein said second mirror is an off-axis section of an elliptical mirror.

11. A condenser as set forth in claim 1 wherein said micromirrors are substantially rectangular.

12. A condenser as set forth in claim 11 wherein each of said micromirrors has a major dimension of between 1 mm and 4 mm.

13. A condenser as set forth in claim 11 wherein adjacent micromirrors of the array of said micromirrors are separated by no more than substantially 15 μm.

14. A condenser as set forth in claim 11 wherein each of said micromirrors has a tilt range between substantially ±2 mr and ±40 mr.

15. A condenser as set forth in claim 11 wherein each of said micromirrors deviates from a flatness by less than substantially 200 nm.

16. A condenser as set forth in claim 11 wherein each of said micromirrors has a micro-roughness of less than substantially 2 Å.

17. A condenser as set forth in claim 1 wherein the number of said micromirrors is between substantially 200 and 1000.

18. A condenser as set forth in claim 17 wherein said mirror array includes a plurality of sections.

19. A condenser as set forth in claim 18 wherein the number of said sections is four.

20. A condenser as set forth in claim 1 wherein said micromirrors are substantially hexagonal.

21. A condenser as set forth in claim 1 wherein said first mirror and said source are separated by a distance substantially equal to 150 mm.

22. A condenser as set forth in claim 1 wherein said first mirror and said mirror array are separated by substantially 440 mm.

23. A condenser as set forth in claim 1 wherein said mirror array and said third mirror are separated by substantially 1150 mm.

24. A condenser as set forth in claim 1 wherein said third mirror and said mask are separated by substantially 155 mm.

25. A condenser as set forth in claim 1 wherein a back focus between said mask and said entrance pupil is substantially 450 mm.

26. A photolithography system wherein an image of a mask is projected onto a wafer comprising:
   a source of propagating EUV radiation;
   a first mirror illuminated by said radiation;
   a mirror array illuminated by said radiation reflected from said first mirror, said mirror array including a plurality of micromirrors, each of said mirrors being selectively actuatable independently of each other;
   a second mirror illuminated by said radiation reflected from said array; and
   a camera operable in a wavelength of said radiation and having an entrance pupil, said first mirror and said second mirror being disposed such that said source is imaged onto a plane of said mask and said mirror array is imaged into said pupil.

27. A condenser as set forth in claim 26 wherein each of said micromirrors is selectively tilted to provide a prescribed coherence of said radiation at all points in the image field at said entrance pupil.

28. A condenser as set forth in claim 26 wherein each of said micromirrors is selectively tilted such that intensity of said radiation is uniform at said mask plane.

29. A condenser as set forth in claim 26 wherein each of said micromirrors is selectively actuatable within a tilt angle range.

30. A condenser as set forth in claim 29 wherein said tilt angle is referenced to either side of a normally coplanar position.

31. A condenser as set forth in claim 26 wherein each of said mirrors is selectively actuatable to one of a plurality of discrete positions.

32. A condenser as set forth in claim 26 wherein said first mirror has an elliptical cross-section.

33. A condenser as set forth in claim 32 wherein said elliptical cross-section is substantially a collimating mirror.

34. A condenser as set forth in claim 26 wherein said first mirror includes a plurality of aspherical mirror segments wherein segments are each an off-axis section of an elliptical mirror.

35. A condenser as set forth in claim 26 wherein said second mirror is an off-axis section of an elliptical mirror.

36. A condenser as set forth in claim 26 wherein said micromirrors are substantially rectangular.

37. A condenser as set forth in claim 36 wherein each of said micromirrors has a major dimension of between 1 mm and 4 mm.

38. A condenser as set forth in claim 36 wherein each of said micromirrors are separated by no more than substantially 15 $\mu$m.

39. A condenser as set forth in claim 36 wherein each of said micromirrors has a tilt range between substantially ±2 mr and ±40 mr.

40. A condenser as set forth in claim 36 wherein each of said micromirrors deviates from a flatness by less than substantially 200 nm.

41. A condenser as set forth in claim 36 wherein each of said micromirrors has a micro-roughness of less than substantially 2 Å.

42. A condenser as set forth in claim 26 wherein a number of said micromirrors is between substantially 200 and 1000.

43. A condenser as set forth in claim 42 wherein said mirror array includes a plurality of sections.

44. A condenser as set forth in claim 43 wherein the number of said sections is four.

45. A condenser as set forth in claim 26 wherein said micromirrors are substantially hexagonal.

46. A condenser as set forth in claim 26 wherein said first mirror and said source are separated by a distance substantially equal to substantially 150 mm.

47. A condenser as set forth in claim 26 wherein said first mirror and said mirror array are separated by substantially 440 mm.

48. A condenser as set forth in claim 26 wherein said mirror array and said third mirror are separated by substantially 1150 mm.

49. A condenser as set forth in claim 26 wherein said third mirror and said mask are separated by substantially 155 mm.

50. A condenser as set forth in claim 26 wherein a back focus between said mask and said entrance pupil is substantially 450 mm.

* * * * *